United States Patent
Colabella et al.

(10) Patent No.: US 6,239,037 B1
(45) Date of Patent: May 29, 2001

(54) AUTOALIGNED ETCHING PROCESS FOR REALIZING WORD LINES AND IMPROVING THE RELIABILITY OF SEMICONDUCTOR INTEGRATED MEMORY DEVICES

(75) Inventors: Elio Colabella, Milan; Luca Pividori, Turin; Adriana Rebora, Agrate Brianza, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/408,160

(22) Filed: Sep. 28, 1999

Related U.S. Application Data

(62) Division of application No. 08/996,615, filed on Dec. 23, 1997.

(51) Int. Cl.[7] .................................................. H01L 21/00
(52) U.S. Cl. ........................ 438/737; 216/38; 438/719; 438/721; 438/745
(58) Field of Search ........................... 438/692, 719, 438/721, 723, 724, 737, 743, 744, 745; 216/2, 38, 88

(56) References Cited

U.S. PATENT DOCUMENTS

| | | | |
|---|---|---|---|
| 5,160,407 | 11/1992 | Latchford et al. | 156/656 |
| 5,240,870 | 8/1993 | Bergemont | 437/43 |
| 5,342,801 | 8/1994 | Perry et al. | 437/52 |
| 5,409,854 | 4/1995 | Bergemont | 437/43 |
| 5,568,422 | 10/1996 | Fujiwara | 365/185.33 |
| 5,672,892 | 9/1997 | Ogura et al. | 257/314 |
| 5,883,409 | 3/1999 | Guterman et al. | 257/316 |
| 5,935,875 * | 8/1999 | Lee | 438/738 X |
| 5,948,703 * | 9/1999 | Shen et al. | 438/719 |

* cited by examiner

Primary Examiner—William Powell
(74) Attorney, Agent, or Firm—Theodore E. Galanthay; Robert Iannucci; Seed IP Law Group PLLC

(57) ABSTRACT

The process proposed allows provision of a matrix topography for electronic memory devices using self-alignment etchings capable of removing those spurious electrical contacts between adjacent memory cells. The self-aligned etching process proposed for providing a plurality of mutually parallel word lines in a first conducting layer deposited over a planarized architecture obtained starting from a semiconductor substrate. Provided on the semiconductor substrate is a plurality of active elements extending along separate parallel lines, e.g., memory cell bit lines, and comprising gate regions formed by a first conducting layer, a dielectric interpoly layer and a second conducting layer with said regions being insulated from each other by dielectric insulation films to form said architecture with said word lines being defined photolithographically by protective strips. The etching process includes: a vertical profile etching for complete removal from the unprotected areas respectively of the first conducting layer, of the second conducting layer of the gate region; a successive etching of the dielectric interpoly layer accompanied by a considerable erosion of the dielectric film of the insulation region so as to totally uncover the first conducting layer, and a concluding etching of the first conducting layer.

8 Claims, 3 Drawing Sheets

AUTOALIGNED ETCHING PROCESS FOR REALIZING WORD LINES AND IMPROVING THE RELIABILITY OF SEMICONDUCTOR INTEGRATED MEMORY DEVICES

CROSS-REFERENCE TO RELATED APPLICATION

This application is a divisional of pending U.S. patent application Ser. No. 08/996,615, filed Dec. 23, 1997.

TECHNICAL FIELD

The present invention relates to a self-aligned etching process for providing word lines and improving the reliability of electronic memory devices integrated on semiconductor substrates displaying a matrix type topography comprising word lines and bit lines.

Specifically the present invention relates to a self-aligned etching process for providing a plurality of parallel word lines in a first conducting layer deposited over a planarized architecture obtained starting from a semiconductor substrate on which is provided a plurality of active elements extending along separate parallel lines, e.g. bit lines, for memory cell comprising gate regions formed by a first conducting layer, an interpoly dielectric layer and a second conducting layer, said gate regions being insulated from each other by at least one insulation region to form this architecture with said word lines being defined photolithographically by protective strips.

The present invention also relates to a memory device with matrix configuration of the cross-point type and comprising bit lines and word lines.

The present invention concerns specifically but not exclusively a self-aligned etching process for providing word lines in electronic memories integrated on contactless semiconductor and with a virtual ground circuitry. The following description is given with reference to this specific field of application with the only purpose of simplifying its explanation.

BACKGROUND OF THE INVENTION

As is well known, EPROM or FLASH-EPROM electronic memory devices require the provision on a semiconductor substrate of a matrix-type topography in which a plurality of bit lines having a floating gate region is intersected above by a plurality of conducting strips properly called word lines A topography of this type is shown in the photograph of FIG. 1 obtained by electronic microscopy techniques.

The conventional provision of this matrix-type topography is not entirely without problems and shortcomings because it was verified experimentally that it is possible that the floating gate regions may find themselves contacted by spurious residues of conducting materials not entirely removed during manufacturing.

In the following description given by way of examples there are again proposed the process steps necessary for defining on a semiconductor substrate a matrix-type topography of an EPROM memory device comprising word lines, bit lines and floating gate regions to better carify those aspects necessary for explaining the technical problems.

Starting from a semiconductor substrate 1, e.g., like that shown in FIG. 2, in which there is already a division into active areas with the possible presence of a field oxide dividing layer 2, and multiple depositions are made over the entire surface of the substrate.

First a thin gate oxide layer 3 is deposited. Then a deposition of a first polysilicon layer 4, identified by the name POLY1, is provided followed by a deposition of a second dielectric interpoly layer 5, e.g., oxide-nitride-oxide or ONO, which is encapsulated above by another deposition of a third polysilicon layer 6 which is identified by the name POLY CAP.

At this point a masked photolithography step which for convenience is identified by the name 'POLY1 mask' defines a topography of protected areas forming the gate regions and related bit lines.

A cascade self-aligned etching allows removal of parallel strips of multiple layers until reaching the active areas of the substrate 1.

This cascade etching removes from the unprotected areas of the photolithography the POLY CAP layer 6, the ONO layer 5, the POLY1 layer 4, the gate oxide layer 3 and the field oxide 2 if necessary where present.

This defines a spatial geometry on the semiconductor substrate 1 in which it is possible to recognize a plurality of active elements extending along separate parallel lines, e.g., memory cell bit lines 13, and corresponding gate regions.

The gate regions 13 are formed as shown in FIG. 2 by a stratified structure of POLY CAP-ONO-POLY1-gate oxide and possibly field oxide, as shown in FIG. 2.

During this self-aligned etching, removal of the POLY CAP layer 6 causes deposition of polymers which create a pair of steps or ribs 10 on the underlying POLY1 layer 4 which thus projects laterally with respect to the layers deposited above as shown in FIGS. 2 and 4.

Another cause which could be at the origin of the formation of this pair of steps 10 is generally an additional oxidation step usually used for sealing the bit lines 13. During this oxidation step the POLY CAP layer 6 can reoxidize more than the POLY1 layer 4 (depending on the type of doping of the POLY1) as shown in FIG. 2.

The above-mentioned steps 10 made up of the POLY1 layer 4 projecting laterally can originate a short circuit between adjacent floating gate regions once a self-aligned etching has been completed to define word lines and hence individual memory cells.

FIG. 3 shows an electronic microscope photograph of a semiconductor substrate having a matrix-type topography after performance of a self-aligned etching to define the word lines, which can be identified in the high-luminosity areas which are united by thin white strips revealing the presence of the steps 10.

The successive process steps for the provision of an EPROM memory device call for the use of a planarization method in which a first insulating dielectric film 8 and a second planarizing dielectric film 7 deposited in the interstitial regions included between the gate regions 13 allow obtaining a planarized architecture 9 as shown in FIG. 2.

It is important to note that the above described process causes the first insulating dielectric film 8 to act as a protective micromask for the step 10 created previously.

Provision of the plurality of word lines intersecting the gate regions 13 calls for deposition of a conducting layer entirely covering the planarized architecture 9 as shown in FIG. 4.

This conducting layer can be obtained by means of successive deposition of a protective layer 12, e.g., of polysilicon and indicated for convenience by the name POLY2, and a final layer 11 of silicide, e.g., tungsten silicide.

To define the spatial geometry of the word lines there is again made use of a conventional photolithography step with an appropriate mask usually indicated as a POLY2 mask designating unprotected areas in which a self-aligned etching can be performed even for the word lines.

Another objective of this etching is to mutually insulate the individual memory cells by removing material from the floating gate regions not protected by the photolithography step.

Those skilled in the art usually perform this self-aligned etching in two successive steps and with a vertical profile.

The first step calls for removal of the conducting layer 11, 12 and the underlying POLYCAP layer 6 while the second step calls for removal of the ONO layer 5 and POLY1 layer 4.

FIG. 5 shows a vertical cross section of an electronic memory devices comprising gate regions 13 planarized by means of insulation regions 7 and 8 after performance of the first self-aligned etching step for a definition of the word lines and memory cells.

This cross section was taken in a region included between two consecutive word lines in which erosion takes place due to the first self-aligned etching step.

In this Figure it can readily be seen that the insulation regions 7 and 8 are only partially etched because the dielectric layer 5 at the end of this etching is still protected by the insulating dielectric film 8.

It is accordingly clear that the step zone 10 is still presented.

The second self-aligned etching step, which is diagrammed in the cross section of FIG. 6A only for the removal of the dielectric layer 5, is insufficient to eliminate the steps 10 if done with a vertical profile.

The final removal of the POLY1 layer 4 with a vertical profile etching is insufficient to remove the step zone 10 because of the persistence of the micromask.

The prior art process described up to this point has provided on the semiconductor substrate 1 a matrix topography comprising gate regions, corresponding bit lines 13 and word lines orthogonal thereto. This topography is widely used in EPROM or $E^2$PROM memory devices and in particular in EPROM, Flash EPROM and EEPROM memory devices having a cross-point and virtual ground structure as described, e.g., in European patent no. 0 573 728.

Although meeting the purpose, there are some critical aspects of the above described process which require a remedy.

In particular, the existence of the pair of steps 10 present in the floating gate regions associated with each bit line 13 between the POLYCAP layer 6 and the underlying layers is undesirable. As mentioned, these steps can originate undesired contacts which can affect the reliability of the memory device.

In addition, the usual self-aligned etchings having a vertical profile for definition of the word lines as well as for insulation of the individual memory cells are quite inadequate for removing said steps 10 as may be seen in FIGS. 3, 5 and 6A.

Indeed, it happens that, after removal of the ONO layer 5 and POLY1 layer 4, the pairs of steps 10 still remain present because they are protected by the micromask created by the first dielectric insulation film 8 used for planarization of the architecture 9.

In this manner the floating gate regions of adjacent memory cells made by means of self-aligned etching of the word lines come into mutual electrical contact.

SUMMARY OF THE INVENTION

An object of the present invention is to conceive a self-aligned etching process for a definition of geometry associated with word lines which would allow overcoming the above-mentioned shortcomings which still limit the reliability of the memory devices provided in accordance with the prior art.

An embodiment of the present invention uses a definition of word lines and individual memory cells, a first self-aligned etching step with a vertical profile limited to removal of a conducting layer and an underlying polysilicon layer.

Advantageously, an embodiment of the present invention provides a second self-aligned etching step that removes a dielectric layer accompanied by a considerable erosion of an insulating dielectric film so as to eliminate a protective micromask of steps formed from the dielectric layer and a second polysilicon layer.

Subsequent removal of the second polysilicon layer then permits mutual insulation of the individual memory cells to avoid that the steps not be removed because of protection by the micromask.

Characteristics and advantages of the process in accordance with the present invention are set forth in the description of an embodiment thereof given below by way of non-limiting example with reference to the annexed drawings.

DETAILED DESCRIPTION OF THE INVENTION

With reference to FIGS. 4, 5, 6A and 6B there is now described a self-aligned etching process for providing a plurality of mutually parallel word lines in a first conducting layer formed by a pair of superimposed layers 11, 12.

Figure 1:
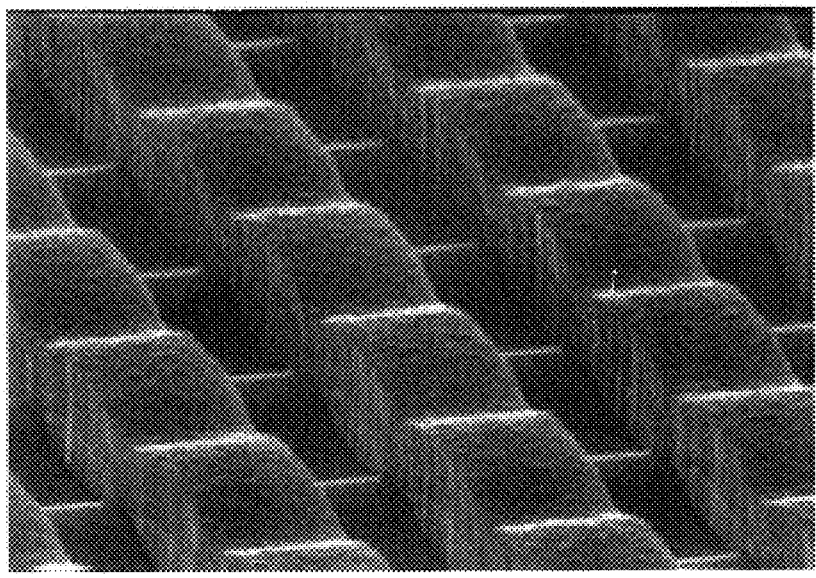
FIG. 1 shows an electronic microscope photograph of a plurality of Flash EPROM memory cells having a matrix-type topography of which can be seen only the bit lines before deposition of a dielectric layer.
Figure 3:
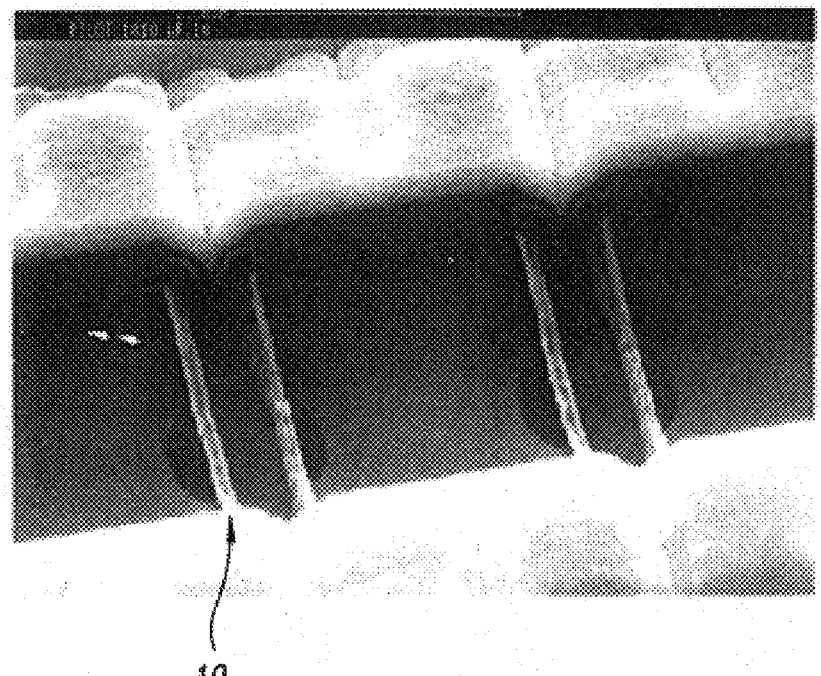
FIG. 3 shows an electronic microscope photograph of a semiconductor substrate having a matrix-type topography and taken after performance of a self-aligned etching for the definition of the word lines.
Figure 2:
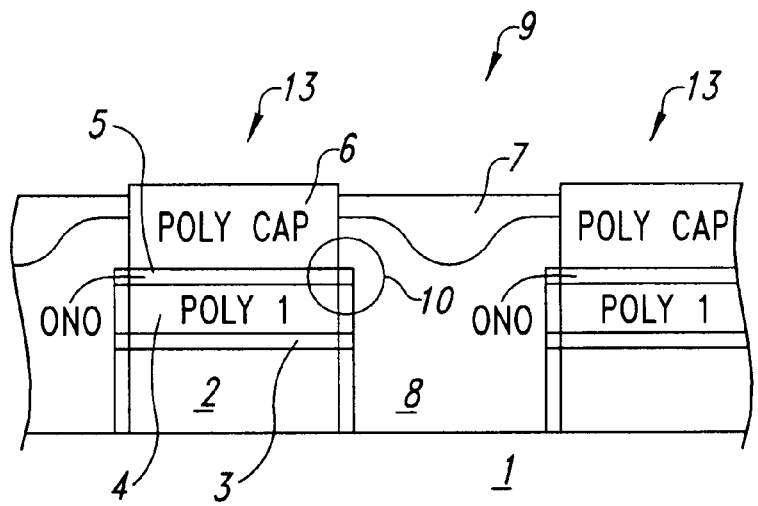
FIG. 2 shows diagrammatically and in enlarged scale a vertical cross section of a semiconductor electronic device with a planarized architecture comprising gate regions conformed as a stratified POLYCAP-ONO-POLY1-gate oxide structure.
Figure 4:
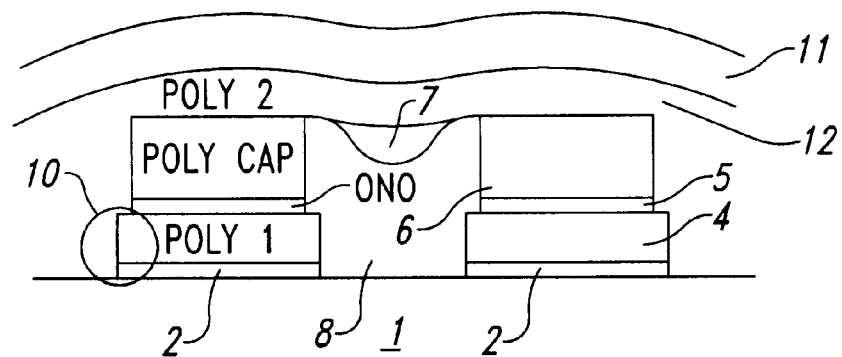
FIG. 4 shows schematically and in enlarged scale a vertical cross section of a semiconductor electronic device with a planarized architecture covered above by a conducting layer provided in accordance with the prior art.

FIG. 4 shows the layers 11, 12 deposited over a planarized architecture 9 obtained starting from a semiconductor substrate 1 on which a plurality of active elements is provided extending along separated parallel lines, e.g., bit lines, of memory cells.

FIG. 4 is an enlarged vertical cross section of the above described device having planarized architecture 9 obtained in a region delimited by two word lines in which is performed the self-aligned etching.

Within this region there are present an optional field oxide layer 2, a thin gate oxide layer 3, a first conducting layer 4, a dielectric interpoly layer 5, e.g., ONO, and a second conducting layer 6. The gate regions are mutually insulated by an insulating dielectric film 8 and a planarized dielectric film 7 forming said planarized architecture 9.

The word lines are defined photolithographically by protective strips orthogonal to the bit lines.

Advantageously in accordance with the present invention the etching for definition of the word line geometry and insulation of the individual memory cell is provided in two successive steps.

In a first step there is provided a self-aligned etching starting from the exposed surface of the additional conducting layer 11, 12. This etching proceeds with a vertical profile for removal of the conducting layer 11, 12 and of the underlying second conducting layer 6 from the gate regions 13 not protected by the photolithographic process. As mentioned above, a POLY2 mask is used for definition of the word lines in the photolithography step.

Figure 5:
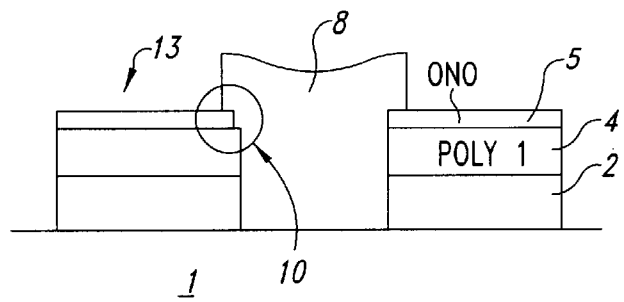
FIG. 5 shows schematically and in enlarged scale a vertical cross section of a semiconductor electronic device comprising gate regions conformed as a stratified ONO-POLY1 structure and insulation regions after provision of a first self-aligned etching step for definition of the word lines in accordance with the prior art.

FIG. 5 shows an enlarged vertical cross section of the self-aligned etching region after the first step which removes the conducting layer 11, 12 and the second conducting layer 6.

This first etching step does not include elimination of the pairs of steps 10 because the dielectric films 7,8 used for the insulation region are only partially removed after the first etching.

Indeed, it can be seen that the dielectric interpoly layer 5 and the underlying first conducting layer 4 are still protected by the micromask formed by the dielectric film 8.

Figure 6A:
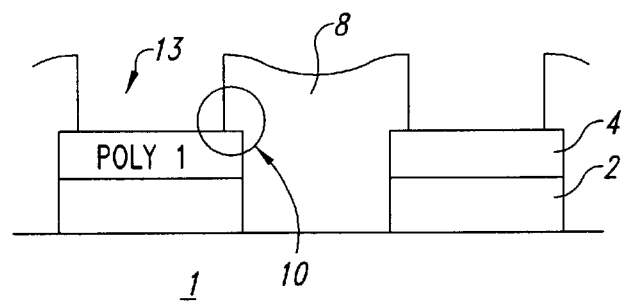
FIG. 6A shows schematically and in enlarged scale a vertical cross section of a semiconductor electronic device comprising gate regions conformed as a stratified POLY1 field oxide structure and insulation regions after provision of a second self-aligned etching step for removal of the ONO layer and definition of the word lines in accordance with the prior art.
Figure 6B:
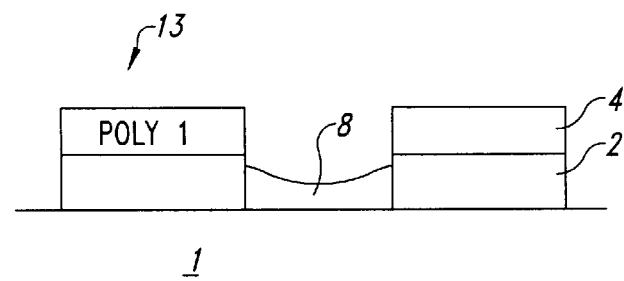
FIG. 6B shows schematically and in enlarged scale a vertical cross section of a semiconductor electronic device comprising gate regions conformed as a stratified POLY1 field oxide structure and insulation regions after provision of a second step of self-aligned etching for removal of the ONO layer and definition of the word lines in accordance with the present invention.

Advantageously the present invention as shown in FIG. 6B provides a second etching step to remove the dielectric interpoly layer 5 accompanied by a considerable erosion of the dielectric film 8 of the insulation region so as to eliminate the protective micromask of the steps 10.

FIG. 6B clearly shows how after the above second etching step the dielectric film 8 has a lower profile with respect to the first conducting layer 4.

This is possible if an etching process much longer than that normally used to remove, e.g., 300 Å of oxide, is used. An etching of this type allows removal of an oxide layer of a thickness comparable to the thickness of the POLY1. In addition this etching allows removal of the oxide over the POLY1 of approximately 800 Å.

For a complete definition of the word lines and individual memory cells one proceeds with a final etching step to eliminate the first POLY1 conducting layer 4.

This final etching step is free to act over the entire surface of the layer 4 without any leaving of the undesired steps 10 which were the cause of the spurious contacts between the gate regions of adjacent cells once the cells are defined with the self-aligned etching in accordance with the prior art.

One of ordinary skill in the art will surely recognize in the process proposed here a solution to all those technical problems in which there are conducting materials previously not removed because protected by undesired micromasks which can cause spurious contacts.

It is noted in particular that the technical problem set forth above and concerning the possibility of spurious contacts between the floating gate regions associated with adjacent memory cells remains even when the profile of the vertical cross section of the gate regions 13 is the trapezoid type and not only in the presence of steps as described.

In conclusion the self-aligned etching proposed by the present invention is capable of ensuring good reliability of the memory devices with matrix configuration if provided in accordance with the process described here.

It should be understood that even though numerous advantages of the present invention have been set forth in the foregoing description, the disclosure is illustrative only. Changes may be made in detail and yet remain within the broad principles of the present invention.

What is claimed is:

1. A self-aligned etching process for providing a plurality of mutually parallel word lines in a first conducting layer deposited over a planarized architecture obtained starting from a semiconductor substrate on which a plurality of active elements is provided extending along separate parallel lines, e.g., bit lines, including memory cells comprising gate regions formed by a second conducting layer, a dielectric interpoly layer and a third conducting layer, said gate regions being insulated from each other by at least one dielectric insulation film to form said architecture with said word lines being defined photolithographically by protective strips, the process comprising:

etching with vertical profile for complete removal from the gate regions of the first conducting layer and the second conducting layer;

subsequently etching the dielectric interpoly layer accompanied by a considerable erosion of the dielectric film of the insulation region in such a manner as to totally uncover the third conducting layer of the gate regions; and etching the third conducting layer after it is uncovered.

2. The self-aligned etching process in accordance with claim 1 wherein the first conducting layer is provided by means of successive deposition of a first and a second layer having different chemical composition.

3. The self-aligned etching process in accordance with claim 2 wherein the first layer is polysilicon.

4. The self-aligned etching process in accordance with claim 2 wherein the second layer is silicide.

5. The self-aligned etching process in accordance with claim 4 wherein the second layer is tungsten silicide.

6. The self-aligned etching process in accordance with claim 1 wherein the third conducting layer and said second conducting layer making up the gate regions are polysilicon.

7. The self-aligned etching process in accordance with claim 1 wherein the dielectric interpoly layer is ONO.

8. A method of self-aligned etching for manufacturing an electronic memory device, with matrix-type topography gate regions of memory cells, integrated on a semiconductor substrate and having a first conducting layer, an intermediate dielectric interpoly layer overlaying the first conductive layer, a second conducting layer overlaying intermediate dielectric intermediate layer, and a third conducting layer overlaying second conductive layer, the memory device further having at least one insulation layer deposited between the gate regions formed by the first conducting layer, the dielectric layer, and the second conducting layer, the method comprising:

defining protected areas of the memory device photolithographically for a definition of word lines;

etching the memory device vertically for complete removal of unprotected areas of the third conducting layer and of the second conducting layer;

etching the dielectric interpoly layer accompanied by a considerable erosion of the insulation layer in such a manner as to totally uncover the first conducting layer; and etching the first conducting layer.

* * * * *